United States Patent
Nakagawa et al.

(10) Patent No.: US 6,950,042 B2
(45) Date of Patent: Sep. 27, 2005

(54) MODULATING APPARATUS AND METHOD, AND DSV CONTROL BIT PRODUCING METHOD

(75) Inventors: Toshiyuki Nakagawa, Kanagawa (JP); Hiroshige Okamura, Chiba (JP); Minoru Tobita, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/467,399

(22) PCT Filed: Dec. 10, 2002

(86) PCT No.: PCT/JP02/12902

§ 371 (c)(1), (2), (4) Date: Aug. 12, 2004

(87) PCT Pub. No.: WO03/050958

PCT Pub. Date: Jun. 19, 2003

(65) Prior Publication Data

US 2005/0017881 A1 Jan. 27, 2005

(30) Foreign Application Priority Data

Dec. 11, 2001 (JP) .......................................... 2001-377598

(51) Int. Cl.[7] .................................................. H03M 5/00
(52) U.S. Cl. ............................................. 341/58; 341/59
(58) Field of Search ............................... 341/58, 59, 95, 341/106, 68, 69, 65; 360/40, 293; 369/59, 275.3, 59.24; 386/126; 375/271

(56) References Cited

U.S. PATENT DOCUMENTS 6,072,756 A * 6/2000 Shigenobu ............... 369/47.19
6,340,938 B1 * 1/2002 Nakagawa .................... 341/58
6,359,930 B1 * 3/2002 Nakagawa et al. ......... 375/253
6,492,920 B2 * 12/2002 Oki et al. .................... 341/106
2004/0125002 A1 * 7/2004 Nakagawa et al. ............ 341/58

FOREIGN PATENT DOCUMENTS

| JP | 7-245565 | 9/1995 |
|----|----------|--------|
| JP | 8-149013 | 6/1996 |
| JP | 11-346154 | 12/1999 |

* cited by examiner

Primary Examiner—Brian Young
(74) Attorney, Agent, or Firm—Frommer Lawrence & Haug LLP; William S. Frommer

(57) ABSTRACT

The present invention relates to a modulation apparatus and method and a DSV-control-bit generating method for suppressing an increase in circuit size of the modulation apparatus. When an input data stream is supplied to a DSV control bit determination unit 31, the DSV control bit determination unit 31 determines a DSV control bit to be inserted into the input data stream. Upon supplying the input data stream to the DSV control bit determination unit 31, the input data stream is simultaneously supplied to a delay processor 32. The input data stream is delayed for a predetermined delay time and supplied to a determined-DSV-control-bit insertion unit 33. The determined-DSV-control-bit insertion unit 33 inserts the DSV control bit determined by the DSV control bit determination unit 31 into a predetermined position of the input data stream supplied by the delay means and supplies the input data stream containing the DSV control bit to a modulator 34. The modulator 34 modulates the input data stream containing the DSV control bit into a code string in accordance with a predetermined coding rule (for example, 1,7PP modulation).

20 Claims, 10 Drawing Sheets

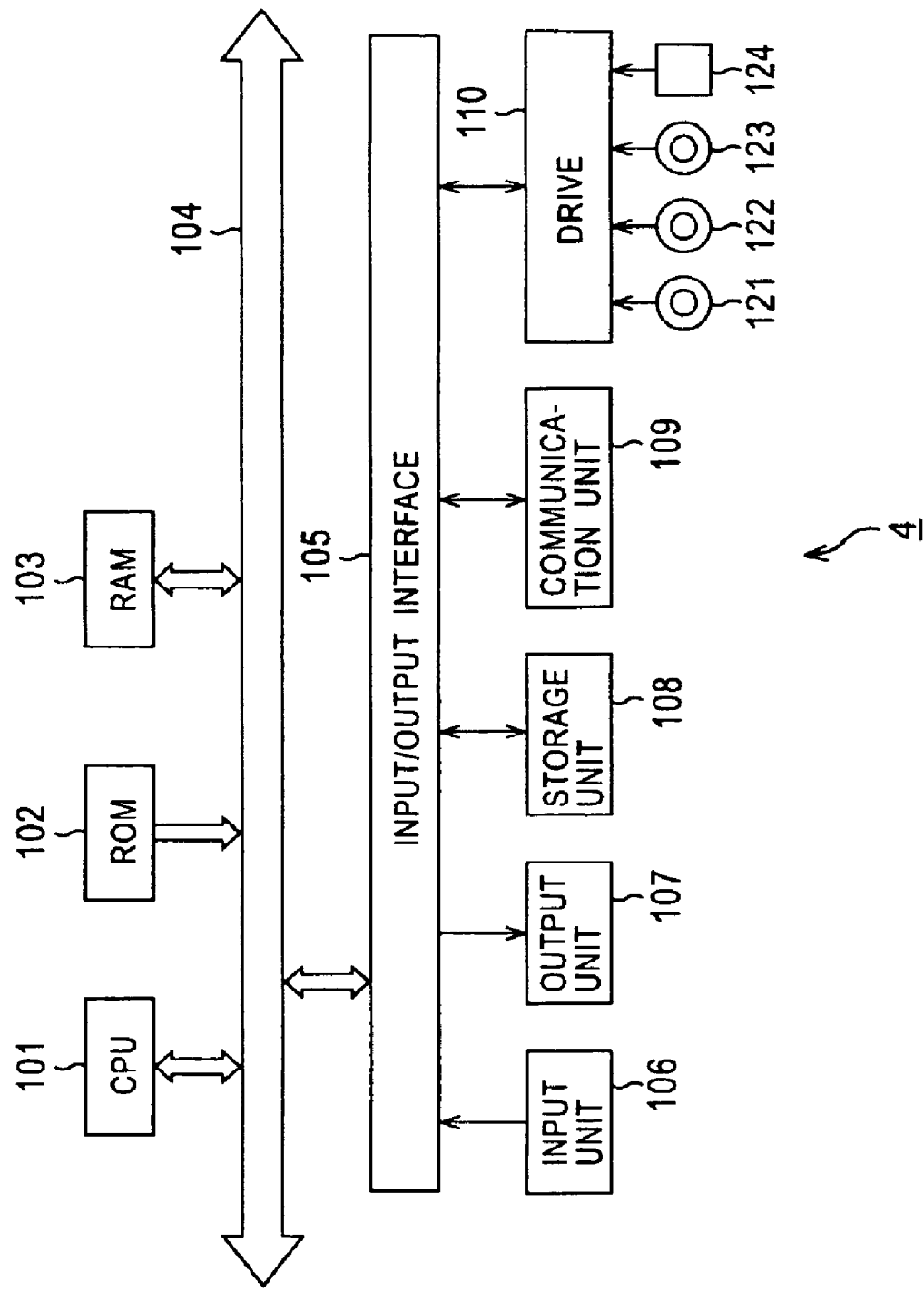

MODULATING APPARATUS AND METHOD, AND DSV CONTROL BIT PRODUCING METHOD

TECHNICAL FIELD

The present invention relates to modulation apparatuses and methods and DSV-control-bit generating methods, and more particularly relates to a modulation apparatus and method and a DSV-control-bit generating method for suppressing an increase in circuit size.

BACKGROUND ART

In transferring data to a predetermined transmission line or in recording data onto a recording medium, such as a magnetic disk, an optical disk, or a magneto-optical disk, the data is modulated to suit the transfer or recording. One known modulation method is block coding. Block coding is to divide a data stream into blocks of m×i bits (hereinafter the blocks are referred to as data words), and each data word is converted into a codeword of n×i bits in accordance with an appropriate coding rule. When i=1, the resultant code is a fixed-length code. When i can be of multiple values, that is, when i is selected from a range of 1 to i max (maximum i) and conversion is performed with the selected i, the resultant code is a variable-length code. The code generated by block coding is defined as a variable-length code (d, k; m, n; r).

In the above description, i denotes the constraint length, and i max is r (maximum constraint length); d denotes the minimum number of consecutive "0s" between consecutive "1s", e.g., the minimum run length of "0"; and k denotes the maximum number of consecutive "0s" between consecutive "1s", e.g., the maximum run length of "0".

In recording the code generated as described above onto an optical disk, a magneto-optical disk, or the like, such as a compact disk (CD) or mini disk (MD), the variable-length code is subjected to NRZI (Non Return to Zero Inverted) modulation in which "1" is inverted whereas "0" is not inverted, and recording is done on the basis of the NRZI-modulated variable-length code (hereinafter referred to as the recording code string). There is a system, such as that on a magneto-optical disk in an initial ISO format having a not-so-high recording density, which records a modulated recording bit string that has not been subjected to NRZI modulation.

The minimum inversion interval of the recording code string is denoted by Tmin, and the maximum inversion interval of the recording code string is denoted by Tmax. Higher recording density in the direction of linear velocity is realized when the minimum inversion interval Tmin is longer, that is, when the minimum run length d is greater. On the other hand, in terms of clock reading, it is preferable to have a shorter maximum inversion interval Tmax, that is, a smaller maximum run length k. Various modulations methods have been proposed.

Specifically, modulation systems proposed or actually used in, for example, optical disks, magnetic disks, magneto-optical disks, and the like are described as follows.

For example, RLL codes (Run Length Limited Code) with the minimum run length d=2 include an EFM (Eight to Fourteen Modulation) code (may also be represented as (2, 10: 8, 17; 1)) used in CD, MD, and the like; an 8–16 code (may also be represented as (2, 10: 8, 16; 1)) used in DVD (Digital Video Disk); an RLL (2–7) (may also be represented as (2, 7; 1, 2; r)) used in PD (Phase Change Disk); and the like.

RLL codes with the minimum run length d=1 include a fixed-length RLL (1-7) (may also be represented as (1, 7; 2, 3; 1)) used in an ISO-format MO disk (Magnetic-Optical Disk); and a variable-length RLL (1-7) (may also be represented as (1, 7; 2, 3; r)) used in a disk drive for a high-density optical disk, magneto-optical disk, or the like.

A conversion table for the variable-length RLL (1-7) is as follows:

TABLE 1

RLL (1, 7; 2, 3, 2)

| | Data word | Codeword |
|---|---|---|
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |

The symbol x in the conversion table corresponds to 1 when the subsequent codeword is 0 and corresponds to 0 when the subsequent codeword is 1. The maximum constraint length r is 2.

The parameters of the variable-length RLL (1-7) are (1, 7; 2, 3; 2). When the bit interval of the recording code string is denoted by T, the minimum inversion interval Tmin expressed as (d+1) is 2(=1+1)T. When the bit interval of the data stream is denoted by Tdata, the minimum inversion interval Tmin expressed as (m/n)×2 is 1.33(=(2/3)×2)Tdata.

In the above description, m/n denotes conversion at the ratio m:n. For example, ⅔ denotes conversion at 2:3 (conversion of a data word of 2×i bits into a codeword of 3×i bits).

The maximum inversion interval Tmax expressed as (k+1)T is 8(=7+1)T ((=(2/3)×8 Tdata=5.33 Tdata). The detection window margin Tw is expressed as (m/n)×Tdata and is 0.67(=2/3)Tdata.

In a code string (channel bit string) generated by RLL (1-7) modulation in Table 1, 2T which is Tmin occurs most frequently, which is followed by 3T, 4T, and so forth. The fact that edge information, such as 2T or 3T, occurs many times with a short cycle is advantageous in reading clock.

In contrast, when the recording linear density becomes higher, the minimum run length causes a problem. Specifically, when 2T (the minimum run length) occurs consecutively, the recording waveform is easily distorted because the waveform output of 2T is smaller than the others and is influenced more easily by defocus, tangential tilt, or the like.

In recording at high linear density, recording with consecutive minimum marks is influenced more easily by disturbance, such as noise, and this may easily lead to a data read error. In such a case in which a data read error occurs, the error often resides in shift of start-edge and end-edge of the consecutive minimum marks. In other words, the generated bit error length becomes longer.

In order to solve this problem, the consecutive minimum run lengths are controlled to better suit high linear density.

In contrast, in recording onto a recording medium or in data transfer, code modulation based on each medium (transfer) is done. When a modulated code contains a DC component, fluctuation or jitter may be caused in various error signals, such as for a tracking error in servo control of a disk drive. It is preferable for the modulated code not to contain a DC component.

In order to solve this problem, DSV (Digital Sum Value) control is proposed. DSV is the sum of bits of an NRZI-modulated (level-coded) bit string (channel bit string) in which "1" corresponds to +1 and "0" corresponds to −1. DSV serves as a reference for a DC component in the code string. Minimizing the absolute value of DSV, that is, performing DSV control, enables suppression of a DC component in the code string.

In the code modulated according to the variable-length RLL (1-7) table shown in Table 1, no DSV control is performed. In such a case, DSV control is performed by calculating DSV of the modulated channel bit string at a predetermined interval and inserting predetermined DSV control bits into the code string.

Basically, the DSV control bits are redundant bits. In view of the efficiency of code conversion, the fewer the DSV control bits, the better.

It is preferable that the minimum run length d and the maximum run length k remain unchanged by the inserted DSV control bits. Changes of (d, k) influence the reading and writing characteristics.

In order to satisfy the above requirements, DSV control must be performed in as efficiently as possible.

While the actual RLL code must satisfy the minimum run length requirement, the maximum run length requirement need not be satisfied. There is a format that uses a pattern exceeding the maximum run length for a sync signal. For example, although EFM plus for DVD has a maximum run length of 11T, EFM plus for DVD allows for 14T as a matter of convenience of the format. By exceeding the maximum run length, for example, the capability of detecting a sync signal or the like is enhanced greatly.

In the RLL (1-7) format with improved conversion efficiency, it is important to "control the consecutive minimum run lengths so as to better suit the high linear density" and to "perform DSV control as efficiently as possible" in association with an increase in linear density.

Accordingly, the assignee of the present invention et al. discloses, in Japanese Patent Application No. 10-150280, a conversion table including, as a conversion code, a basic code where d=1, k=7, m=2, and n=3; a coding rule that the remainder of the number of "1s" in each element of a data stream divided by two must be one or zero and equal the remainder of the number of "1s" in a converted channel bit string divided by two; a first replacement code for limiting the consecutive minimum run lengths d to a predetermined number or less; and a second replacement code for satisfying the run length limitation.

Specifically, when a disk drive with high linear density reads/writes an RLL code, a pattern with consecutive minimum run lengths often causes a long error.

When DSV control is performed on an RLL code, such as the RLL (1-7) code, DSV control bits need to be inserted into a code string (channel bit string) at arbitrary intervals. As described above, since the DSV control bits are redundant bits, it is preferable to have fewer DSV control bits. In order to maintain the minimum run length or the maximum run length, the DSV control bits of at least 2 bits or greater are necessary.

The assignee of the present invention et al. discloses, in Japanese Patent Application No. 10-150280, an RLL code with the minimum run length d=1 (d, k; m, n) and a conversion table, which is shown in Table 2, for limiting the number of consecutive minimum run lengths and for performing complete DSV control using efficient control bits while maintaining the minimum run length and the maximum run length (hereinafter referred to as a 1,7PP table; and a code according to 1,7PP table is referred to as a 1,7PP code):

TABLE 2

1, 7PP
(d, k, m, n, r) = (1, 7, 2, 3, 4)

| Data word | Codeword |
| --- | --- |
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| "110111 | 001 000 000 (next010) |
| 00001000 | 000 100 100 100 |
| 00000000 | 010 100 100 100 |
| if xx1 then *0* = 000 | |
| xx0 then *0* = 101 | |

Termination table

| | |
| --- | --- |
| 00 | 000 |
| 0000 | 010 100 |
| "110111 | 001 000 000 (next010) |

When next channel bits are '010'
convert '11 01 11' to '001 000 000' after
using main table and termination table.

As an example of a modulation apparatus using the 1,7PP table, the assignee of the present invention discloses, in Japanese Patent Application No. 10-150280, a modulation apparatus 1 shown in FIG. 1.

The modulation apparatus 1 includes a DSV control bit determination and insertion unit 11 for determining "1" or "0" serving as a DSV control bit and inserting the DSV control bit into an input data stream at arbitrary intervals; a modulator 12 for modulating the data stream containing the DSV control bits; and an NRZI unit 13 for converting the output of the modulator 12 into a recording code string. Although not shown in the diagram, the modulation apparatus 1 includes a timing management unit for generating a timing signal, supplying the timing signal to the above components, and managing timing.

In Japanese Patent Application No. 09-342416, the assignee of the present invention et al. discloses a specific example of another modulation apparatus, namely, a modulation apparatus 2 shown in FIG. 2.

The modulation apparatus includes a DSV control bit insertion unit 21 for inserting "1" or "0" serving as a DSV control bit into a data stream at arbitrary intervals. At this time, there is a data stream into which the DSV control bit "1" is inserted and another data stream into which the DSV control bit "0" is inserted. The modulation apparatus further includes a modulator 22 for modulating the data stream containing the DSV control bits and a DSV controller 23 for NRZI-modulating the modulated code string into level data, calculating DSV of the level data, and consequently outputting a DSV-controlled recording code string.

As described above, the 1,7PP code is advantageous in solving the above problems. In contrast, compared with a modulation apparatus using a known method or a technique for performing DSV control on the RLL (1,7) code, the configuration of the known modulation apparatus using the 1,7PP code is complicated, and the circuit size is increased.

For example, in the modulation apparatus 2 shown in FIG. 2, the register configuration in the modulator 22 is shown in FIG. 3. Specifically, the modulator 22 has a modulation (1,7PP modulation) portion and a delay portion corresponding to a DSV control interval (DSV section) in one integrated unit in order to transfer data corresponding to the DSV control interval to the DSV controller 23 at a subsequent stage. As a result, the modulator 22 needs two registers, that is, an input register 22a (register 22a for the data stream) and an output register 22b (register 22b for the channel bit string). The number of registers required corresponds to the DSV control interval. Two pairs of registers (registers 22a and 22b) are necessary for the DSV control bit "0" and the DSV control bit "1".

DISCLOSURE OF INVENTION

In view of these circumstances, it is an object of the present invention to suppress an increase in circuit size of a modulation apparatus.

A modulation apparatus of the present invention includes DSV-control-bit generating means for generating a DSV control bit to be inserted into an input bit string in order to control a DSV of a recording code string or a transmission code string; timing adjusting means for adjusting transmission timing for transmitting the input bit string; DSV-control-bit-inserted bit string generating means for generating a DSV-control-bit-inserted bit string by inserting the DSV control bit generated by the DSV-control-bit generating means into a predetermined position of the input bit string whose transmission timing is adjusted by the timing adjusting means; and first modulation means for modulating the DSV-control-bit-inserted bit string generated by the DSV-control-bit-inserted bit string generating means into a channel bit string on the basis of a conversion rule (d, k; m, n; r).

The modulation apparatus may further include NRZI means for performing NRZI modulation of the channel bit string generated by modulation by the first modulation means to generate the recording code string or the transmission code string.

The conversion rule may state that the remainder of the number of "1s" in a predetermined block of the input bit string or the DSV-control-bit-inserted bit string divided by two equals the remainder of the number of "1s" in the corresponding block of the channel bit string divided by two.

The conversion rule may state that the number of consecutive minimum run length d of the channel bit string is limited to a predetermined number or less.

The conversion rule may state a variable-length code (d, k; m, n; r) where the minimum run length d=1, the maximum run length k=7, the length of basic data prior to conversion m=2, and the length of basic channel bits subsequent to conversion n=3.

Data of m length, which is the length of basic data, may be input for a time period in which the channel bit string of n length, which is the length of the basic channel bits, is output.

The DSV-control-bit generating mean may include first-candidate-bit-inserted bit string generating means for generating a first-candidate-bit-inserted bit string, which is a candidate for the DSV-control-bit-inserted bit string, by inserting a first candidate bit for the DSV control bit into the predetermined position of the input bit string; second-candidate-bit-inserted bit string generating means for generating a second-candidate-bit-inserted bit string, which is another candidate for the DSV-control-bit-inserted bit string, by inserting a second candidate bit for the DSV control bit into the predetermined position of the input bit string; second modulation means for modulating, on the basis of the same conversion rule as the conversion rule used by the first modulation means, the first-candidate-bit-inserted bit string generated by the first-candidate-bit-inserted bit string generating means into a first candidate channel bit string, which is a candidate for the channel bit string, and for modulating the second-candidate-bit-inserted bit string generated by the second-candidate-bit-inserted bit string generating means into a second candidate channel bit string, which is another candidate for the channel bit string; DSV calculating means for calculating a DSV of each of the first and second candidate channel bit strings generated by modulation by the second modulation means; and DSV control bit determining means for determining one of the first and second candidate bits as the DSV control bit on the basis of the DSVs calculated by the DSV calculating means.

The DSV calculating means may include section DSV calculating means for calculating a section DSV of a current DSV control section of each of the first and second candidate channel bit strings; cumulative DSV calculating means for calculating a cumulative DSV on the basis of the determination result by the DSV control bit determining means; and adding means for calculating the DSV by adding each section DSV calculated by the section DSV calculating means and the cumulative DSV immediately before the current DSV control section, the cumulative DSV being calculated by the cumulative DSV calculating means.

The first and second modulation means each may have a minimum number of registers required to perform modulation based on the coding rule.

The modulation apparatus may further include first sync signal inserting means for inserting a sync pattern including a preset unique pattern into the channel bit string. The DSV-control-bit generating means may include second sync signal inserting means for inserting the same sync pattern as the sync pattern inserted by the first sync signal inserting means into each of the first and second candidate channel bit strings generated by modulating the first- and second-candidate-bit-inserted bit strings generated by inserting the first and second candidate bits, respectively, into the input bit string. The DSV calculating means may calculate the DSV on the basis of each of the first and second candidate channel bit strings, each of which includes the sync pattern inserted by the second sync signal inserting means.

The timing adjusting means may adjust the transmission timing by adding a delay time to the input bit string.

The timing adjusting means may insert a temporary value prior to determination of the DSV control bit into the input bit string at predetermined intervals.

The modulation apparatus may further include checking information generating means for calculating a final cumulative DSV of the recording code string or the transmission code string, determining whether or not the calculated final cumulative DSV is within a predetermined range, and generating checking information on the basis of the determination result. The DSV-control-bit generating means may generate the DSV control bit on the basis of the checking information generated by the checking information generating means.

When it is determined that the final cumulative DSV is out of the predetermined range, the checking information generating means may reset the final cumulative DSV to zero and generate an error signal serving as the checking information. The DSV-control-bit generating means may internally calculate a cumulative DSV for generating the DSV control bit and, when the error signal is generated by the checking information generating means, may reset the cumulative DSV to zero.

A modulation method of the present invention includes a DSV-control-bit generating step of generating a DSV control bit to be inserted into an input bit string in order to control a DSV of a recording code string or a transmission code string; a timing adjusting step of adjusting transmission timing for transmitting the input bit string; a DSV-control-bit-inserted bit string generating step of generating a DSV-control-bit-inserted bit string by inserting the DSV control bit generated in the DSV-control-bit generating step into a predetermined position of the input bit string whose transmission timing is adjusted in the timing adjusting step; and a modulation step of modulating the DSV-control-bit-inserted bit string generated in the DSV-control-bit-inserted bit string generating step into a channel bit string on the basis of a conversion rule (d, k; m, n; r).

A program on a recording medium of the present invention includes a DSV-control-bit generating step of generating a DSV control bit to be inserted into an input bit string in order to control a DSV of a recording code string or a transmission code string; a timing adjusting step of adjusting transmission timing for transmitting the input bit string; a DSV-control-bit-inserted bit string generating step of generating a DSV-control-bit-inserted bit string by inserting the DSV control bit generated in the DSV-control-bit generating step into a predetermined position of the input bit string whose transmission timing is adjusted in the timing adjusting step; and a modulation step of modulating the DSV-control-bit-inserted bit string generated in the DSV-control-bit-inserted bit string generating step into a channel bit string on the basis of a conversion rule (d, k; m, n; r).

A program of the present invention includes a DSV-control-bit generating step of generating a DSV control bit to be inserted into an input bit string in order to control a DSV of a recording code string or a transmission code string; a timing adjusting step of adjusting transmission timing for transmitting the input bit string; a DSV-control-bit-inserted bit string generating step of generating a DSV-control-bit-inserted bit string by inserting the DSV control bit generated in the DSV-control-bit generating step into a predetermined position of the input bit string whose transmission timing is adjusted in the timing adjusting step; and a modulation step of modulating the DSV-control-bit-inserted bit string generated in the DSV-control-bit-inserted bit string generating step into a channel bit string on the basis of a conversion rule (d, k; m, n; r).

According to a modulation apparatus and method, a recording medium, and a program of the present invention, a DSV control bit to be inserted into an input bit string is generated in order to control a DSV of a recording code string or a transmission code string. Transmission timing for transmitting the input bit string is adjusted. The generated DSV control bit is inserted into a predetermined position of the input bit string, whose transmission timing is adjusted, to generate a DSV-control-bit-inserted bit string. The generated DSV-control-bit-inserted bit string is modulated into a channel bit string on the basis of a conversion rule (d, k; m, n; r).

A DSV-control-bit generating method of the present invention includes a first-candidate-bit-inserted bit string generating step of generating a first-candidate-bit-inserted bit string, which is a candidate for a DSV-control-bit-inserted bit string, by inserting a first candidate bit for a DSV control bit into a predetermined position of an input bit string; a second-candidate-bit-inserted bit string generating step of generating a second-candidate-bit-inserted bit string, which is another candidate for the DSV-control-bit-inserted bit string, by inserting a second candidate bit for the DSV control bit into the predetermined position of the input bit string; a modulation step of modulating, on the basis of the same conversion rule as a conversion rule applied when modulating the input bit string, the first-candidate-bit-inserted bit string generated in the first-candidate-bit-inserted bit string generating step into a first candidate channel bit string, which is a candidate for a channel bit string, and for modulating the second-candidate-bit-inserted bit string generated in the second-candidate-bit-inserted bit string generating step into a second candidate channel bit string, which is another candidate for the channel bit string; a DSV calculating step of calculating a DSV of each of the first and second candidate channel bit strings generated by modulation in the modulation step; and a DSV control bit determining step of determining one of the first and second candidate bits as the DSV control bit on the basis of the DSVs calculated in the DSV calculating step.

A program on a recording medium of the present invention includes a first-candidate-bit-inserted bit string generating step of generating a first-candidate-bit-inserted bit string, which is a candidate for a DSV-control-bit-inserted bit string, by inserting a first candidate bit for a DSV control bit into a predetermined position of an input bit string; a second-candidate-bit-inserted bit string generating step of generating a second-candidate-bit-inserted bit string, which is another candidate for the DSV-control-bit-inserted bit string, by inserting a second candidate bit for the DSV control bit into the predetermined position of the input bit string; a modulation step of modulating, on the basis of the same conversion rule as a conversion rule applied when modulating the input bit string, the first-candidate-bit-inserted bit string generated in the first-candidate-bit-inserted bit string generating step into a first candidate channel bit string, which is a candidate for a channel bit string, and for modulating the second-candidate-bit-inserted bit string generated in the second-candidate-bit-inserted bit string generating step into a second candidate channel bit string, which is another candidate for the channel bit string; a DSV calculating step of calculating a DSV of each of the first and second candidate channel bit strings generated by modulation in the modulation step; and a DSV control bit determining step of determining one of the first and second candidate bits as the DSV control bit on the basis of the DSVs calculated in the DSV calculating step.

A program of the present invention includes a first-candidate-bit-inserted bit string generating step of generating a first-candidate-bit-inserted bit string, which is a candidate for a DSV-control-bit-inserted bit string, by inserting a first candidate bit for a DSV control bit into a predetermined position of an input bit string; a second-candidate-bit-inserted bit string generating step of generating a second-candidate-bit-inserted bit string, which is another candidate for the DSV-control-bit-inserted bit string, by inserting a second candidate bit for the DSV control bit into the predetermined position of the input bit string; a modulation step of modulating, on the basis of the same conversion rule as a conversion rule applied when modulating the input bit string, the first-candidate-bit-inserted bit string generated in the first-candidate-bit-inserted bit string generating step into a first candidate channel bit string, which is a candidate for a channel bit string, and for modulating the second-candidate-bit-inserted bit string generated in the second-candidate-bit-inserted bit string generating step into a second candidate channel bit string, which is another candidate for the channel bit string; a DSV calculating step of calculating a DSV of each of the first and second candidate channel bit strings generated by modulation in the modulation step; and a DSV control bit determining step of determining one of the first and second candidate bits as the DSV control bit on the basis of the DSVs calculated in the DSV calculating step.

According to a DSV-control-bit generating method, a recording medium, and a program of the present invention, a first-candidate-bit-inserted bit string, which is a candidate for a DSV-control-bit-inserted bit string, is generated by inserting a first candidate bit for a DSV control bit into a predetermined position of an input bit string. A second-candidate-bit-inserted bit string, which is another candidate for the DSV-control-bit-inserted bit string, is generated by inserting a second candidate bit for the DSV control bit into the predetermined position of the input bit string. On the basis of the same conversion rule as a conversion rule applied when modulating the input bit string, the generated first-candidate-bit-inserted bit string is modulated into a first candidate channel bit string, which is a candidate for channel bits; and the generated second-candidate-bit-inserted bit string is modulated into a second candidate channel bit string, which is another candidate for the channel bits. A DSV of each of the first and second candidate channel bit strings is calculated. One of the first and second candidate bits is determined as the DSV control bit on the basis of the calculated DSVs.

BRIEF DESCRIPTION OF THE DRAWINGS

FIG. 10 is a block diagram showing an example of the configuration of another modulation apparatus according to the present invention.

BEST MODE FOR CARRYING OUT THE INVENTION

Figure 4:
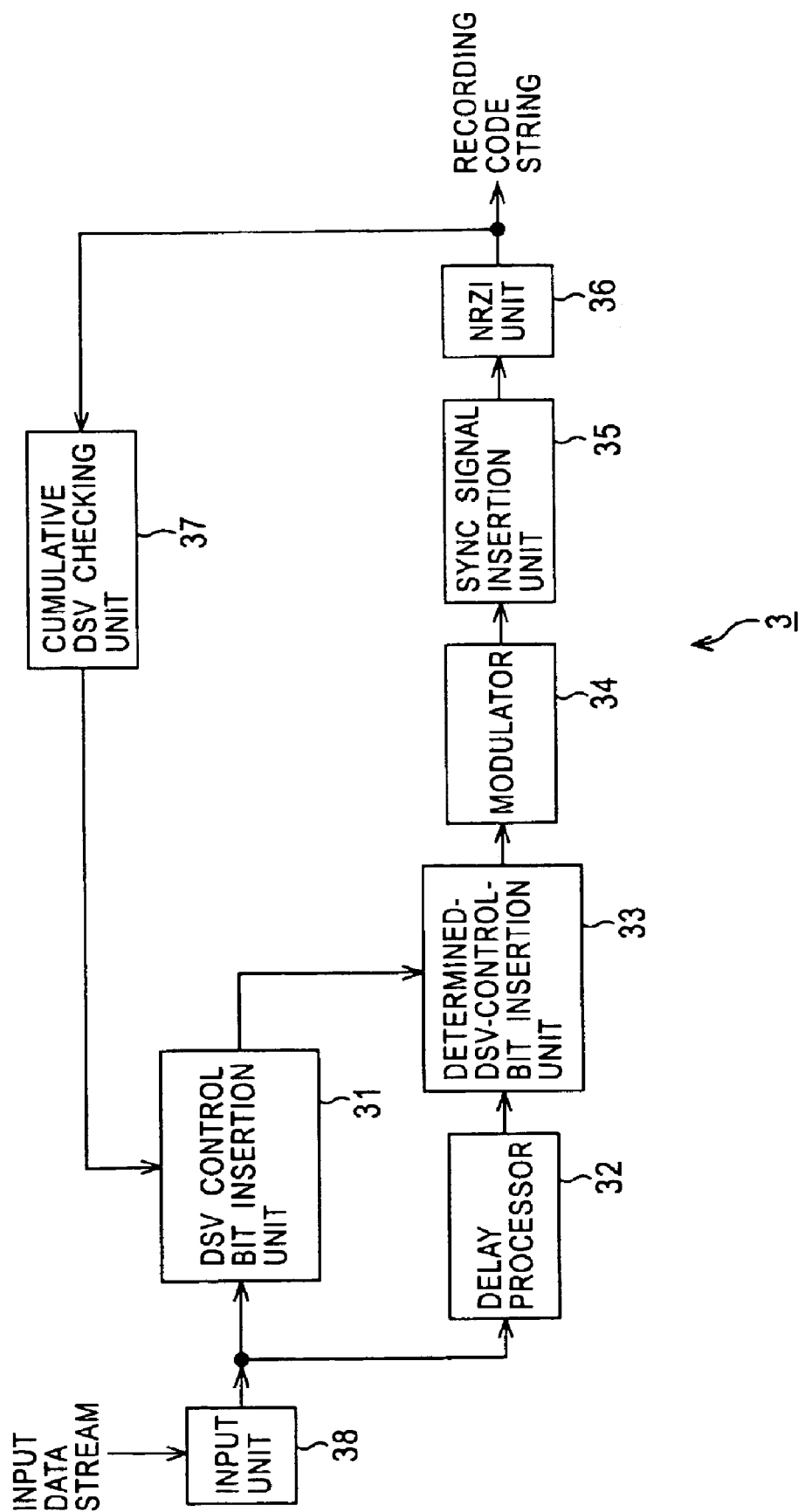
FIG. 4 is a block diagram showing an example of the configuration of a modulation apparatus according to the present invention.

FIG. 4 shows an example of the configuration of a modulation apparatus 3 according to the present invention.

The modulation method employed by the modulation apparatus 3 is not limited. In this example, the modulation apparatus 3 converts a data stream into, for example, a variable-length code (d, k; m, n; r)=(1, 7; 2, 3; 4).

An input unit 38 receives an input data stream supplied from the outside and supplies the input data stream to a DSV control bit determination unit 31 and a delay processor 32.

The DSV control bit determination unit 31 executes a predetermined arithmetic operation to determine the DSV control bit "1" or "0" to be inserted into the supplied input data stream and supplies the determination result to a determined-DSV-control-bit insertion unit 33.

The delay processor 32 delays the supplied input data stream for a predetermined delay time and supplies the delayed input data stream to the determined-DSV-control-bit insertion unit 33. Specifically, the delay processor 32 adjusts the transmission timing to supply the input data stream to the determined-DSV-control-bit insertion unit 32.

The predetermined delay time is set on the basis of the timing to insert, by the determined-DSV-control-bit insertion unit 33 described below, the DSV control bit determined by the DSV control bit determination unit 31 into a predetermined position of the input data stream output by the delay processor 32.

When the determined-DSV-control-bit insertion unit 33 receives, at a predetermined time, the input data stream supplied by the delay processor 32 and the DSV-control-bit determination result (the result indicating whether the DSV control bit is "0" or "1") supplied at a predetermined time by the DSV control bit determination unit 31, the determined-DSV-control-bit insertion unit 33 inserts a DSV control bit corresponding to the received determination result into the predetermined position (hereinafter referred to as the DSV position) of the received input data stream to generate a new data stream (hereinafter referred to as a DSV-control-bit-inserted bit string in order to be distinguished from other data streams) and supplies the DSV-control-bit-inserted bit string to a modulator 34.

Specifically, the predetermined delay time of the delay processor 32 is set so that a bit corresponding to the DSV position of the input data stream will be input to the determined-DSV-control-bit insertion unit 33 at the above-described predetermined time.

The modulator 34 modulates the DSV-control-bit-inserted bit string into a code string (channel bit string) in accordance with a predetermined conversion rule (e.g., 1,7PP table shown in Table 2) and supplies the code string to a sync signal insertion unit 35.

The sync signal insertion unit 35 inputs a prepared sync signal to a predetermined position of the code string supplied by the modulator 34 at a predetermined time (differing from that of the determined-DSV-control-bit insertion unit 33) and supplies the resultant code string to an NRZI unit 36.

The sync signal consists of a predetermined pattern containing a predetermined number of channel bits and is referred to as Frame Sync hereinafter.

The NRZI unit 36 performs NRZI modulation of the code string supplied by the sync signal insertion unit 35 to generate a recording code string and outputs the recording code string to the outside and to a cumulative DSV checking unit 37.

As described above, bit-string permutation by inverting 1 and not inverting 0 of a code string is referred to as NRZI modulation. In other words, the code string prior to being NRZI-modulated is a bit string indicating the edge position, whereas the NRZI-modulated recording code string corresponds to a bit string indicating the H/L (High/Low) level of recording data.

The cumulative DSV checking unit 37 receives the recording code string supplied by the NRZI unit 36, calculates the cumulative DSV so far (hereinafter referred to as the final cumulative DSV in order to be distinguished from other DSVs), determines whether or not the calculated final cumulative DSV is within a predetermined range, and generates checking information based on the determination result. Specifically, when the cumulative DSV checking unit 37 determines that the final cumulative DSV is out of the predetermined range, the cumulative DSV checking unit 37 resets the final cumulative DSV to "0" or sets the final cumulative DSV to a predetermined initial value, generates an error signal serving as the checking information, and supplies the error signal to the DSV control bit determination unit 31.

Specifically, the cumulative DSV checking unit 37 determines whether or not the final cumulative DSV at each moment exceeds the predetermined range (e.g., a range from −128 to +127 or a range from 0 to 255 when represented in sign and magnitude notation). When it is determined that the final cumulative DSV exceeds the predetermined range, the error signal is supplied to a cumulative DSV calculator 55, which will be described later, in the DSV control bit determination unit 31 shown in FIG. 5. The cumulative DSV calculator 55 resets the calculated cumulative DSV so far to "0" or sets the calculated cumulative DSV so far to the predetermined initial value.

In this example, when the cumulative DSV checking unit 37 determines that the final cumulative DSV is within the predetermined range, the cumulative DSV checking unit 37 generates no checking information. Alternatively, the cumulative DSV checking unit 37 may generate a signal corresponding to "normal" or the like serving as the checking information.

Figure 5:
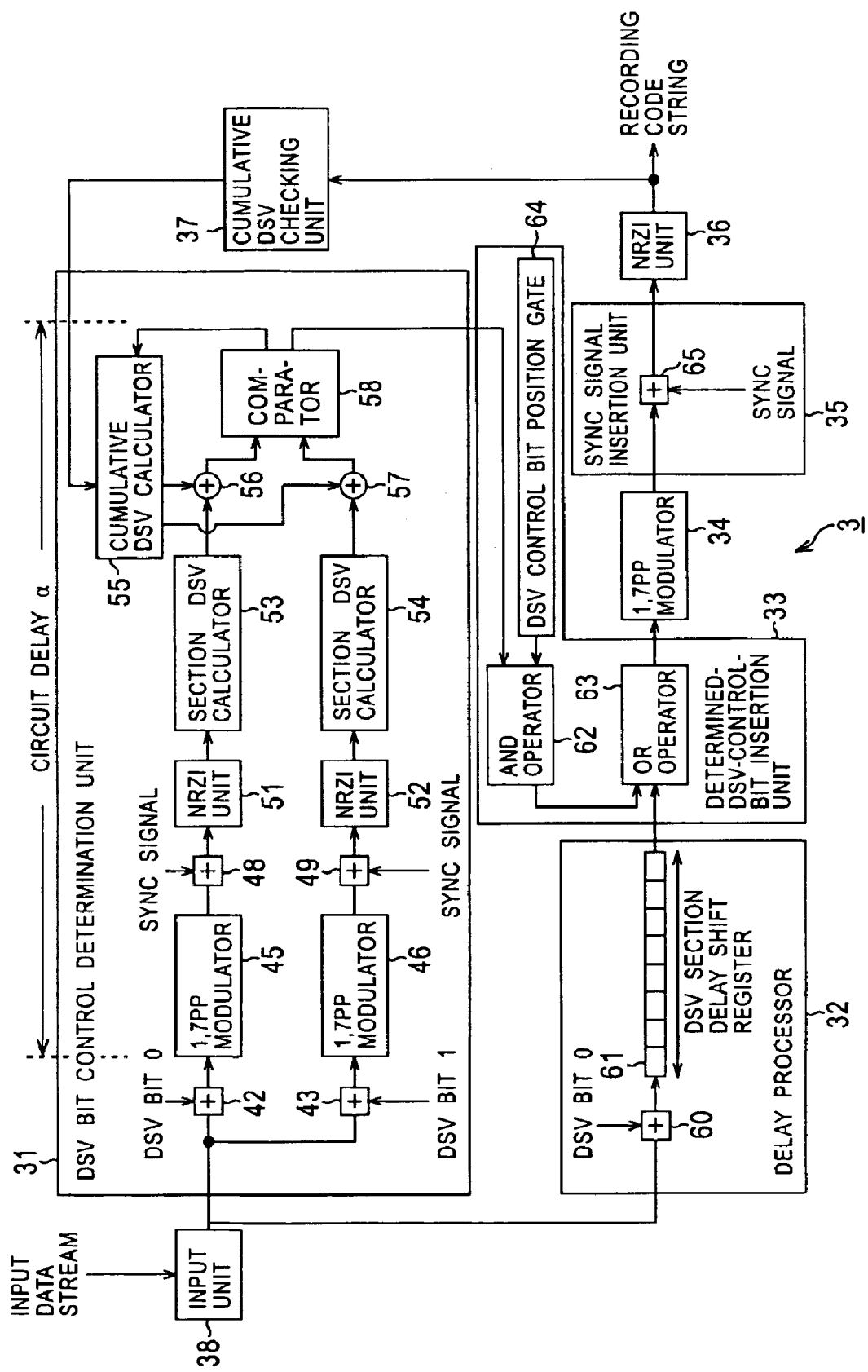
FIG. 5 is a block diagram showing details of the configuration of the modulation apparatus shown in FIG. 4.

Referring to FIG. 5, the modulation apparatus 3 will be described in more detail. Specifically, FIG. 5 shows an example of the detailed configuration of the modulation apparatus 3.

In FIG. 5, the symbol "+" in the square represents a portion that processes a data stream and functions as an insertion unit or a selector. In order to simplify the description, the symbol is simply referred to as an adder.

Referring to FIG. 5, the input data stream received by the input unit 38 is supplied to the DSV control bit determination unit 31 and the delay processor 32 at the same time.

In the DSV control bit determination unit 31, an adder 42 inserts "0" serving as a first candidate bit for the DSV control bit into the predetermined position (DSV position) of the received input data stream to generate a data stream serving as a first candidate for the DSV-control-bit-inserted bit string (hereinafter referred to as a first-candidate-bit-inserted bit string) and supplies the first-candidate-bit-inserted bit string to a 1,7PP modulator 45.

The 1,7PP modulator 45 modulates the first-candidate-bit-inserted bit string into a code string (hereinafter referred to as a first candidate code string in order to be distinguished from other code strings) in accordance with, for example, the above-described 1,7PP table shown in Table 2 and supplies the first candidate code string to an adder 48.

The adder 48 inserts, at a predetermined time, Frame Sync (sync signal) into a predetermined position of the first candidate code string supplied by the 1,7PP modulator 45 and supplies the resultant code string to an NRZI unit 51.

As described above, for example, the 1,7PP table shown in Table 2 is used in this example. The 1,7PP table contains a termination table for inserting Frame Sync. The 1,7PP modulator 45 performs termination based on the termination table.

Specifically, termination is to set, on a data stream, a break point at a position immediately before a position at which Frame Sync is to be inserted and to terminate table-based conversion (modulation) at the break point.

Since the 1,7PP table has a variable-length structure, the table-based conversion has a variable end position. The modulation apparatus 3 uses the above-described termination table if necessary to terminate the table-based conversion at an arbitrary position on the data stream in units of two.

The adder 48 inserts Frame Sync containing the predetermined number of channel bits into a position immediately after the end position of the table-based conversion at the time the table-based conversion is terminated. As described above, Frame Sync contains a predetermined pattern distinguishable from other code strings (a unique pattern not included in conversion codes in the conversion table).

In this example, the same Frame Sync is inserted by the above-described adder 48, an adder 49, and an adder 65, which will be described later.

The NRZI unit 51 performs NRZI modulation of the first candidate code string supplied by the adder 48 to generate a recording code string (hereinafter referred to as a first candidate symbol code string in order to be distinguished from other recording code strings) and supplies the first candidate recording code string to a section DSV calculator 53.

The section DSV calculator 53 calculates a DSV in a predetermined DSV section (hereinafter referred to as a section DSV in order to be distinguished from other DSVs) on the basis of the first candidate recording code string and supplies the section DSV to an adder 56.

The adder 56 adds the section DSV of the first candidate recording code string and the cumulative DSV so far supplied by the cumulative DSV calculator 55 described below and supplies the sum to a comparator 58.

In contrast, an adder 43 inserts "1" serving as a second candidate bit for the DSV control bit into the predetermined position (DSV position) of the received input data stream to generate a data stream serving as a second candidate for the DSV-control-bit-inserted bit string (hereinafter referred to as a second-candidate-bit-inserted bit string) and supplies the second-candidate-bit-inserted bit string to a 1,7PP modulator 46. The second-candidate-bit-inserted bit string supplied to the 1,7PP modulator 46 is modulated, as in the above-described first-candidate-bit-inserted bit string, by the 1,7PP modulator 46 into a code string (hereinafter referred to as a second candidate code string to be distinguished from other code strings). The adder 49 inserts Frame Sync into the second candidate code string at a predetermined time (predetermined position). An NRZI unit 52 performs NRZI modulation of the second candidate code string containing Frame Sync to generate a recording code string (hereinafter referred to as a second candidate recording code string to be distinguished from other recording code strings). The second candidate recording code string is supplied to a section DSV calculator 54.

The section DSV calculator 54 calculates a section DSV in a predetermined DSV section on the basis of the second candidate recording code string and supplies the section DSV to an adder 57.

The adder 57 adds the section DSV of the second candidate recording code string and the cumulative DSV so far supplied by the cumulative DSV calculator 55 described below and supplies the sum to the comparator 58.

Accordingly, the cumulative DSV of the data stream generated by inserting "0" serving as a candidate for the DSV control bit into the input data stream (the first-candidate-bit-inserted bit string) and the cumulative DSV of the data stream generated by inserting "1" serving as another candidate for the DSV control bit into the input data stream (the second-candidate-bit-inserted bit string) are supplied to the comparator 58.

The comparator 58 compares the absolute values of the two cumulative DSVs, selects the data stream having the cumulative DSV whose absolute value is smaller (first- or second-candidate-bit-inserted bit string), and determines, as the DSV control bit to be actually inserted into the input data stream, the first or second candidate DSV control bit included in the selected data stream ("0" when the first-candidate-bit-inserted bit string is selected and "1" when the second-candidate-bit-inserted bit string is selected). Specifically, the comparator 58 supplies a DSV control bit selection signal (signal indicating "1" or "0") corresponding to the determined DSV control bit to an AND operator 62.

The comparator 58 supplies the cumulative DSV of the selected data stream to the cumulative DSV calculator 55.

The cumulative DSV calculator 55 receives the cumulative DSV supplied by the comparator 58 and determines the received cumulative DSV as the cumulative DSV. When the subsequent section DSV of the first or second candidate recording code string is supplied to the adder 56 or the adder 57, the cumulative DSV calculator 55 supplies the cumulative DSV determined immediately before the supply of the section DSV to the adder 56 or the adder 57.

As described above, when the final cumulative DSV corresponding to the currently output recording code string exceeds the predetermined range, the cumulative DSV checking unit 37 supplies the error signal to the cumulative DSV calculator 55. The cumulative DSV calculator 55 receives the error signal and resets the currently determined cumulative DSV to 0 or sets the currently determined cumulative DSV to the predetermined initial value.

In the delay processor 32, an adder 60 inserts "0" serving as a temporary value prior to determination of the DSV control bit into the predetermined position (DSV position) of the input data stream supplied by the input unit 38 to generate a new data stream (hereinafter referred to as a temporary-DSV-control-bit-inserted bit string to be distinguished from other data streams) and supplies the temporary-DSV-control-bit-inserted bit string to a DSV section delay shift register 61.

Specifically, the temporary-DSV-control-bit-inserted bit string is the same data stream as the first-candidate-bit-inserted bit string generated by the above-described adder 42.

In this example, "0" is inserted as the temporary value prior to determination of the DSV control bit. When a combination of logic circuits in the determined-DSV-control-bit insertion unit 33 described below changes, "1" may be inserted. A temporary-DSV-control-bit-inserted bit string in this case is the same data stream as the second-candidate-bit-inserted bit string generated by the above-described adder 43.

The DSV section delay shift register 61 delays the temporary-DSV-control-bit-inserted bit string for a predetermined delay time and supplies the delayed temporary-DSV-control-bit-inserted bit string to the determined-DSV-control-bit insertion unit 33.

The DSV section delay shift register 61 contains registers, the number of which corresponds to a delay of x bits corresponding to the DSV control section, and, if necessary, a delay of α bits corresponding to a circuit delay (delay corresponding to the circuit delay α shown in FIG. 5).

The order of the adder 60 and the shift register 61 of the delay processor 32 may be reversed. Specifically, the adder 60 may insert "0" serving as the temporary value prior to determination of the DSV control bit into the input data stream delayed by the shift register 61 to generate a temporary-DSV-control-bit-inserted bit string and may supply the temporary-DSV-control-bit-inserted bit string to the determined-DSV-control-bit insertion unit 33.

In the determined-DSV-control-bit insertion unit 33, the AND operator 62 performs an AND operation (logical AND) of "1" supplied at a predetermined time by a DSV control bit position gate 64 and the DSV control bit selection signal indicating "0" or "1" supplied by the above-described comparator 58 and supplies the logical operation result to an OR operator 63.

The OR operator 63 performs an OR operation (logical OR) of the operation result ("1" or "0") supplied by the AND operator 62 and predetermined bit data of the temporary-DSV-control-bit-inserted bit string supplied by the DSV section delay shift register 61 and supplies the logical operation result to the 1,7PP modulator 34.

When the delay processor 32 (DSV section delay shift register 61) supplies bit data corresponding to the DSV position of the temporary-DSV-control-bit-inserted bit string ("0" inserted by the adder 60 and serving as the temporary value prior to determination of the DSV control bit) to the OR operator 63, the above-described DSV control bit position gate 64 supplies "1" to the AND operator 62 at that time.

As described above, when "1" serving as the DSV control bit selection signal is supplied to the AND operator 62 and "1" is supplied by the DSV control bit position gate 64 to the AND operator 62 (when a bit corresponding to the DSV position is supplied to the OR operator 63), the AND operator 62 supplies "1" serving as the logical operation result to the OR operator 63.

Specifically, the OR operator 63 receives "1" supplied by the AND operator 62 and bit data that is supplied by the delay processor 32 and that corresponds to the DSV position, that is, "0" inserted as the temporary DSV control bit by the adder 60, performs an OR operation of the received "1" and "0", and supplies "1" serving as the logical operation result to the 1,7PP modulator 34.

In other words, when the DSV control bit determined by the DSV control bit determination unit 31 is "1", the determined-DSV-control-bit insertion unit 33 converts "0 (temporary value prior to determination of the DSV control bit)" inserted into the DSV position by the adder 60 into "1 (DSV control bit determined by the DSV control bit determination unit 31)".

In contrast, when the DSV control bit determined by the DSV control bit determination unit 31 is "0", the determined-DSV-control-bit insertion unit 33 uses "0 (temporary value prior to determination of the DSV control bit)" inserted into the DSV position by the adder 60, unchanged, as the DSV control bit (performs no conversion).

Accordingly, the determined-DSV-control-bit insertion unit 33 inserts the DSV control bit determined by the DSV control bit determination unit 31 into the DSV position of the temporary-DSV-control-bit-inserted bit string (position at which the temporary value prior to determination of the DSV control bit is inserted) to generate a DSV-control-bit-inserted bit string and supplies the DSV-control-bit-inserted bit string to the 1,7PP modulator 34.

Since the 1,7PP modulator 34 has the same configuration as the above-described 1,7PP modulator 45 and the 1,7PP modulator 46, and since the adder 65 of the sync signal insertion unit 35 has the same configuration as the above-described adder 48 and adder 49, descriptions of the 1,7PP modulator 34 and the adder 65 are omitted.

Since the NRZI unit 36 and the cumulative DSV checking unit 37 have already been described, descriptions of the NRZI unit 36 and the cumulative DSV checking unit 37 are omitted.

The modulator 34 in FIG. 4 and the 1,7PP modulator 34 in FIG. 5 are the same modulator. In order to emphasize that the modulator performs 1,7PP modulation, in FIG. 5, the modulator is expressed as the 1,7PP modulator 34.

Figure 6:
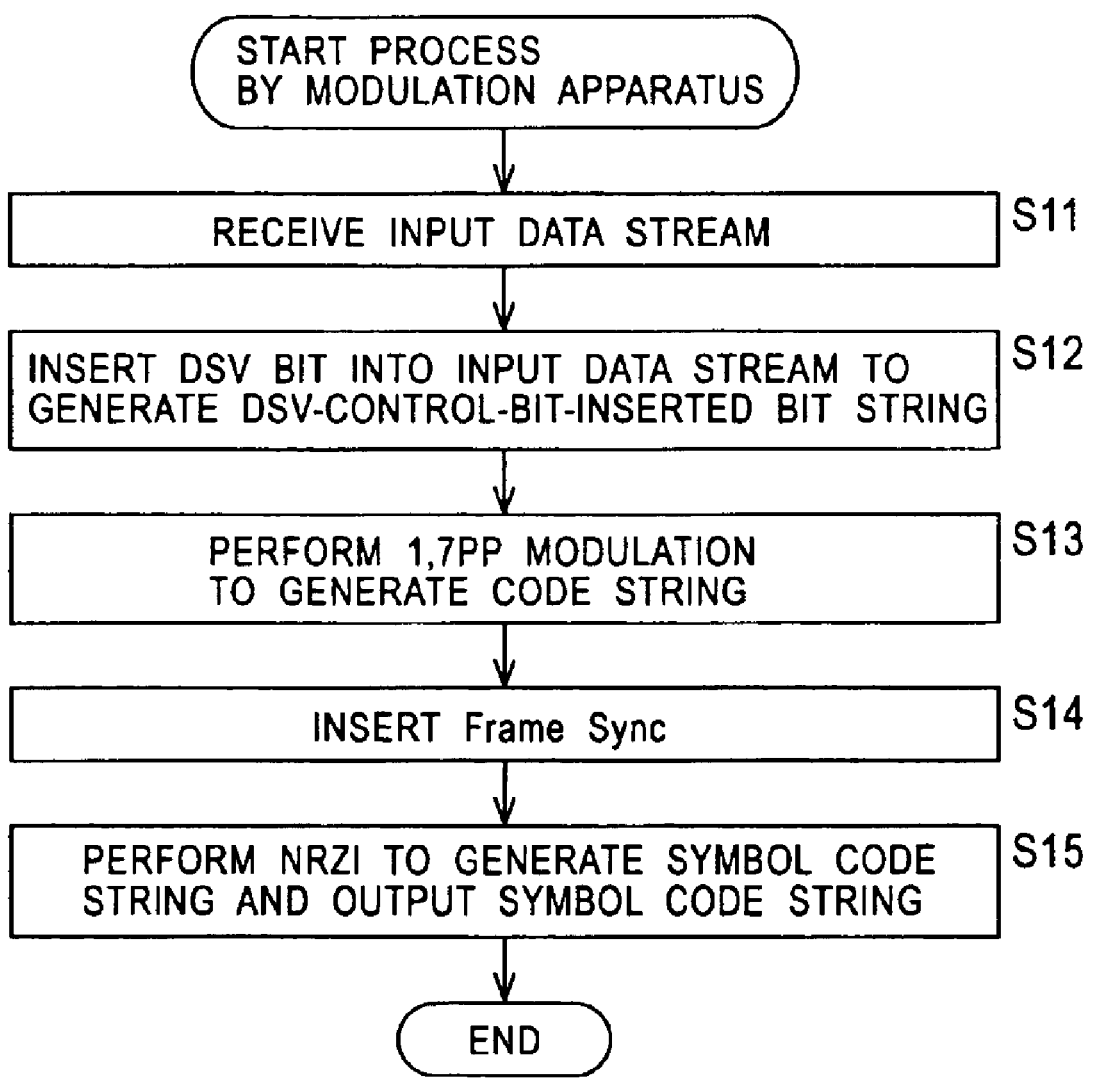
FIG. 6 is a flowchart for describing the operation of the modulation apparatus shown in FIG. 4.

With reference to the flowchart of FIG. 6, the operation of the modulation apparatus 3 will now be described.

Figure 7:
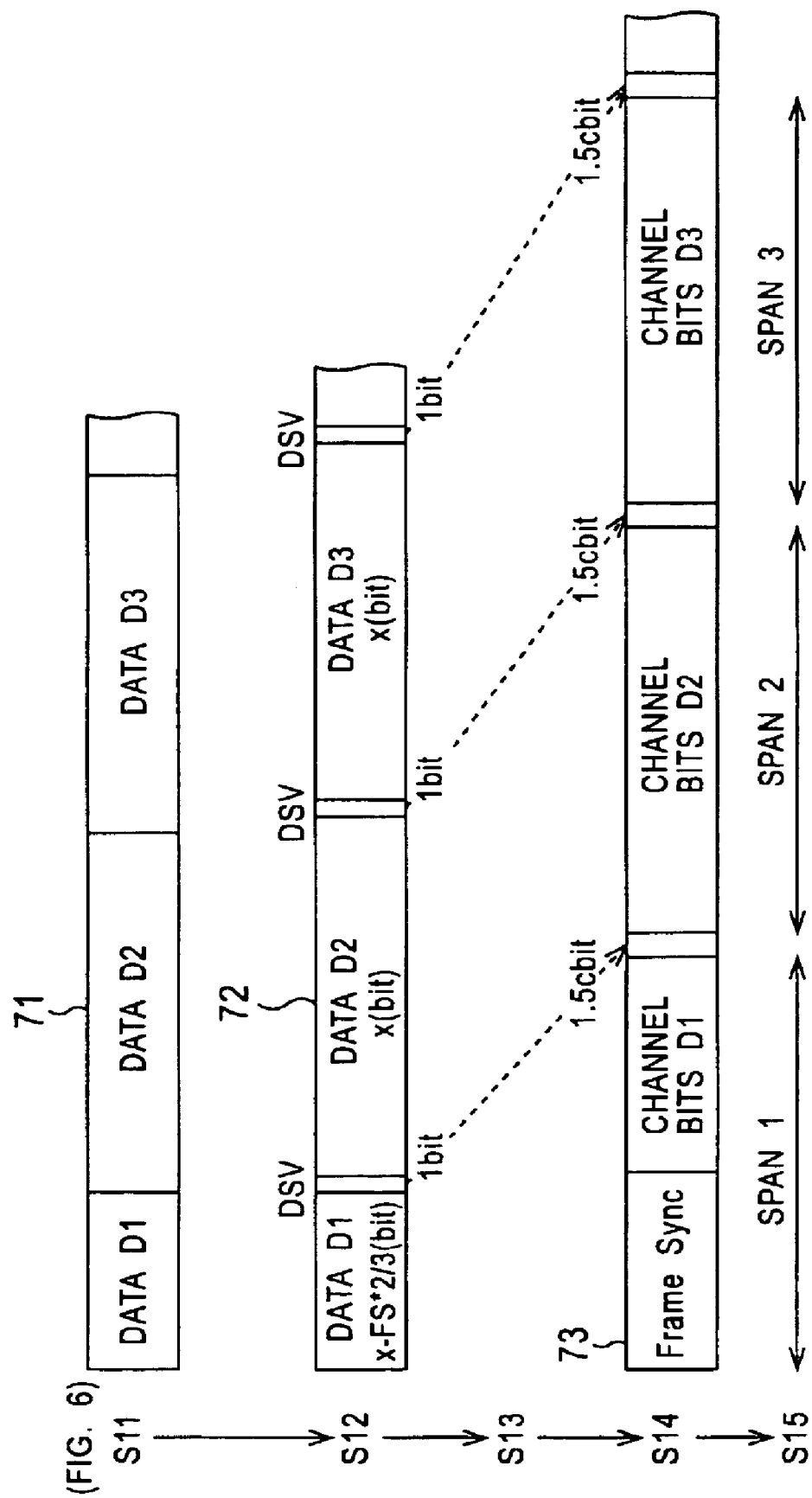
FIG. 7 is a diagram for describing the data format at each stage of a data stream modulated by the modulation apparatus shown in FIG. 4.

An input data stream 71 shown in FIG. 7 is supplied to the modulation apparatus 3.

In step S11, the modulation apparatus 3 receives the input data stream 71.

Figure 8:
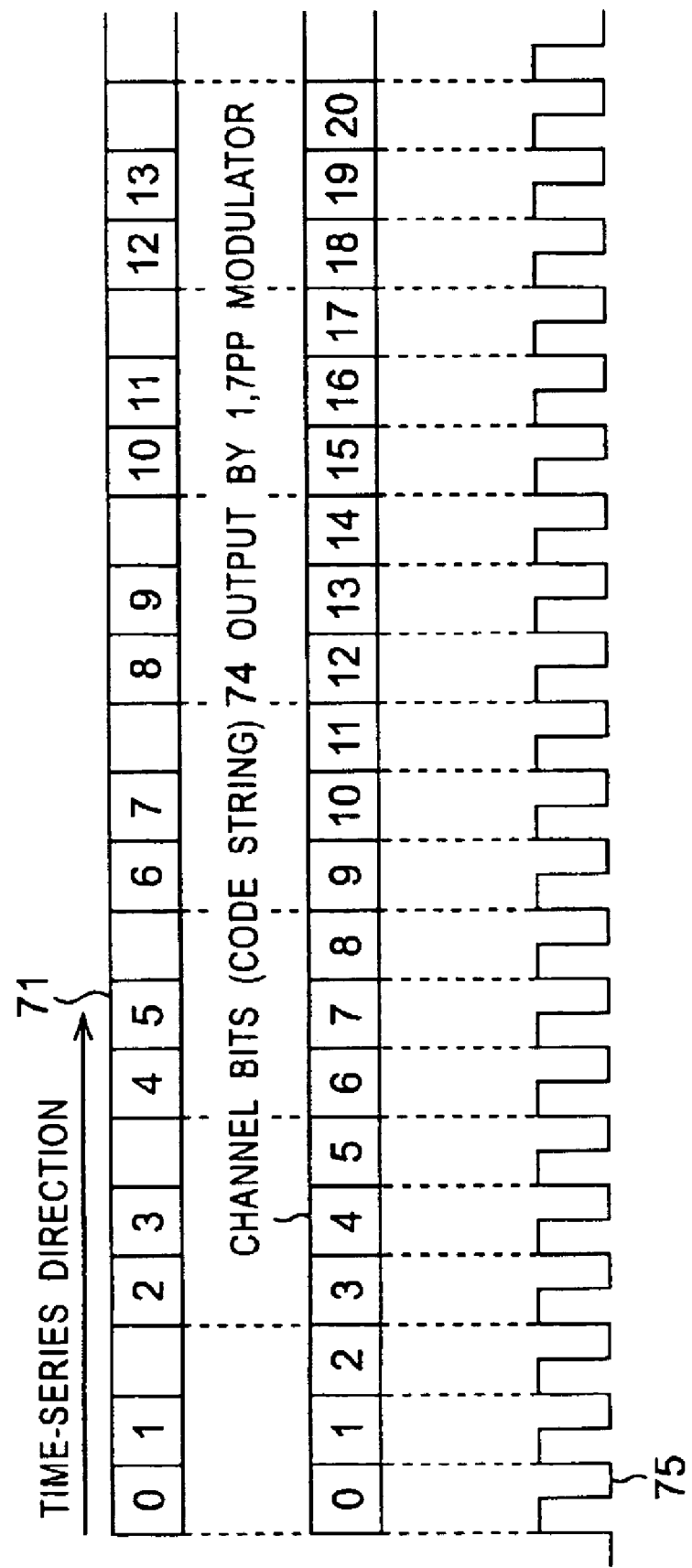
FIG. 8 is a chart for describing timing of data to be input to the modulation apparatus shown in FIG. 4.

The time at which the input data stream 71 is input is as shown in FIG. 8. Specifically, a channel bit string (code string) 74 output by the 1,7PP modulator 34 is output as a serial recording code string in synchronization with a predetermined clock 75. In other words, one codeword is output every clock cycle. In contrast, the input data stream 71 is input in accordance with the conversion ratio m/n of the 1,7PP modulator 34. Specifically, in this example, the conversion ratio is 2/3. The amount of data of a codeword is three, whereas the amount of data of a data word of the input data stream 71 is two. As shown in FIG. 8, the modulation apparatus 3 receives, of the input data stream 71, predetermined two data words within two clock cycles and stops receiving the input data stream 71 for one clock cycle. Accordingly, a mismatch in the conversion ratio between the input data and the output code is adjusted.

Referring to FIG. 7, a DSV section of the input data stream 71 has x bits. A 1-bit DSV control bit is inserted at the end of each x-bit data. In order to be distinguished from unit data, i.e., a data word, to be modulated by the 1,7PP modulator 34, the x-bit data is referred to as data Dk (k is an integer). In other words, the DSV position of data Dk is immediately after the end of the data Dk. Data D1 into which Frame Sync is inserted has a short DSV section. Specifically, Data D1 consists of x-Fsx(2/3) bits (Fs is the number of bits of Frame Sync).

Referring back to FIG. 6, in step S12, the modulation apparatus 3 determines the DSV control bit and inserts the DSV control bit into the predetermined position of the input data stream 71 to generate a DSV-control-bit-inserted bit string 72 shown in FIG. 7.

Specifically, when each data word of the input data stream 71 is supplied to the DSV control bit determination unit 31 in the order shown in FIG. 8, the DSV control bit determination unit 31 receives each data word and determines the DSV control bit to be inserted into the DSV position of x-bit data received, that is, data Dk.

At the same time, the input data stream 71 is also supplied to the delay processor 32 in the order shown in FIG. 8 and delayed for a predetermined delay time, and the delayed input data stream 71 is supplied to the determined-DSV-control-bit insertion unit 33.

The determined-DSV-control-bit insertion unit 33 inserts the DSV control bit (bit "0" or "1") of the data Dk, which is determined by the DSV control bit determination unit 31, into the DSV position of the data Dk at the time the bit at the DSV position of the data Dk is supplied by the delay processor 32 to generate the DSV-control-bit-inserted bit string 72 and supplies the DSV-control-bit-inserted bit string 72 to the 1,7PP modulator 34.

In step S13, the modulation apparatus 3 performs 1,7PP modulation of the DSV-control-bit-inserted bit string 72 to generate a predetermined code string.

Specifically as described above (as shown in FIG. 8), since the input data is received in units of two data words (stopped for one clock cycle), the 1,7PP modulator 34 modulates the DSV-control-bit-inserted bit string 72 in units of two data words. In other words, the 1,7PP modulator 34 processes the data in units of three clock cycles (three channel bits). The timing is generated by a counter or the like (not shown).

Figure 9:
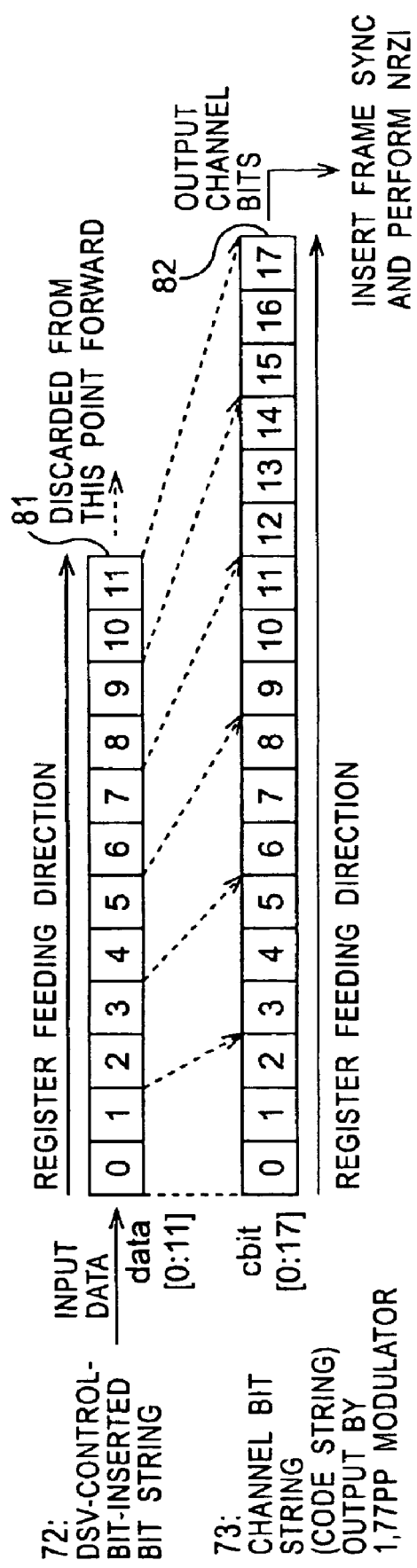
FIG. 9 is a diagram showing an example of the register configuration in a modulator of the modulation apparatus shown in FIG. 4.

The register configuration in the 1,7PP modulator 34 is as shown in FIG. 9. Also, the register configuration in each of the 1,7PP modulator 45 and the 1,7PP modulator 46 is as shown in FIG. 9.

Specifically, an input register 81 of the 1,7PP modulator 34 (register 81 associated with the DSV-control-bit-inserted bit string 72 supplied to the 1,7PP modulator 34) and an output register 82 (register 82 associated with a code string 73 output by the 1,7PP modulator 34) have minimum number of registers required to modulate each data word in accordance with the 1,7PP table shown in Table 2. Specifically, the input register 81 is provided with a number of registers which are 12 bits. The output register 82 is provided with a number of registers which are 18 bits. The 1,7PP modulator 34 includes a timing control register (not shown).

The number of registers required by the 1,7PP modulator 34 is the minimum number of registers required to modulate each data word and does not depend on the DSV interval of the format (in this example, the x-bit section). In other words, the registers required by the 1,7PP modulator 34 are provided without taking into consideration a delay corresponding to a DSV control interval portion.

When the input data word consists of two bits (constraint length i=1), the 1,7PP modulator 34 places the bits into [0, 1] of the input register 81 shown in FIG. 9. Referring to [0,1] replaced with the corresponding bits, the 1,7PP modulator 34 modulates the bits when a predetermined condition is satisfied and places the channel bits into [0, 1, 2] of the output register 82.

Similarly, when the input data word consists of four bits (constraint length i=2), the 1,7PP modulator 34 refers to [0, 1, 2, 3] of the input register 81 containing the corresponding bits, modulates the bits when a predetermined condition is satisfied, and places the channel bits into [0, 1, 2, 3, 4, 5] of the output register 82.

When the input data word consists of six bits (constraint length i=3), the 1,7PP modulator 34 refers to [0, 1, 2, 3, 4, 5] of the input register 81 containing the corresponding bits, modulates the bits when a predetermined condition is satisfied, and places the channel bits into [0, 1, 2, 3, 4, 5, 6, 7, 8] of the output register 82.

In the case of the maximum constraint length, that is, when the input data word consists of eight bits (constraint length i=4), the 1,7PP modulator 34 refers to [0, 1, 2, 3, 4, 5, 6, 7] of the input register 81 containing the corresponding bits, modulates the bits when a predetermined condition is satisfied, and places the channel bits into [0, 1, 2, 3, 4, 5, 6, 7, 8, 9, 10, 11] of the output register 82.

When processing the Prohibit rmtr portion (110111-next_cbit:010), the 1,7PP modulator 34 refers to [0, 1, 2, 3, 4, 5, 6, 7, 8, 9, 10, 11] of the input register 81 and, when a predetermined condition is satisfied, replaces predetermined positions of the output register 82 with the channel bits.

Accordingly, the 1,7PP modulator 34 uses the input register 81 and the output register 82 to perform 1,7PP modulation of the DSV-control-bit-inserted bit string 72 to generate a channel bit string (code string) and supplies the channel bit string (code string) to the sync signal insertion unit 35.

In step S14, the modulation apparatus 3 inserts Frame Sync into a predetermined position of the code string output by the 1,7PP modulator 34 to generate the code string (channel bit string) 73 shown in FIG. 7.

Specifically, when the 1,7PP modulator 34 performs the above-described termination, the sync signal insertion unit 35 inserts Frame Sync (sync signal) at the head of the immediate data Dk (data D1 in this example) to generate the code string (channel bit string) 73 shown in FIG. 7 and supplies the code string 73 to the NRZI unit 36.

Subsequent to the insertion of Frame Sync into the code string 73, DSV control bits are inserted into the code string 73 at equal intervals (span 1=span 2=span 3), thus achieving appropriate DSV control.

More specifically, when the 1,7PP modulator 34 performs termination, the 1,7PP modulator 34 stops outputting data. At the same time, the adder 65 of the sync signal insertion unit 35 changes the selector and adds Frame Sync of a predetermined length. When Frame Sync is added, the adder 65 changes the selector (to the original state), and the 1,7PP modulator 34 resumes data output (the code string 74 is supplied to the sync signal insertion unit 65).

Although the above method is described as an example of a method of inserting Frame Sync, the method is not limited to the above-described method. For example, the 1,7PP modulator 34 may perform termination and then supply a temporary code string of the same length as predetermined Frame Sync to the sync signal insertion unit 35, and the sync signal insertion unit 35 may replace the temporary code string with the predetermined Frame Sync.

In step S15, the modulation apparatus 3 performs NRZI modulation of the code string 73 to generate a recording code string and outputs the recording code string to the outside.

Specifically, the NRZI unit 36 performs NRZI modulation of the code string 73 supplied by the sync signal insertion unit 35 to generate a recording code string and outputs the recording code string to the outside and to the cumulative DSV checking unit 37.

The cumulative DSV checking unit 37 receives the recording code string supplied by the NRZI unit 36, calculates the final cumulative DSV, and determines whether or not the calculated final cumulative DSV is within a predetermined range. When it is determined that the final cumulative DSV is out of the predetermined range, the cumulative DSV checking unit 37 supplies the determination result to the cumulative DSV calculator 55 of the DSV control bit determination unit 31. The cumulative DSV calculator 55 resets the calculated cumulative DSV so far to 0 or sets the calculated cumulative DSV so far to a predetermined initial value.

The cumulative DSV supplied to the cumulative DSV calculator 55 of the DSV control bit determination unit 31 may be a value supplied by the comparator 58 shown in FIG. 5 or may be, for example, the final cumulative DSV calculated by the above-described cumulative DSV checking unit 37. Specifically, supplying the final cumulative DSV calculated by the cumulative DSV checking unit 37 to the cumulative DSV calculator 55 at a predetermined time enables the cumulative DSV calculator 55 to operate in a manner similar to the above-described operation.

The code string output by the NRZI unit 36 is a recording code string in this example. In the case of transmission of the output result, the NRZI unit 36 outputs a transmission code string. In this case, the operation of the solid-state imaging device 3 remains unchanged.

Figure 1:
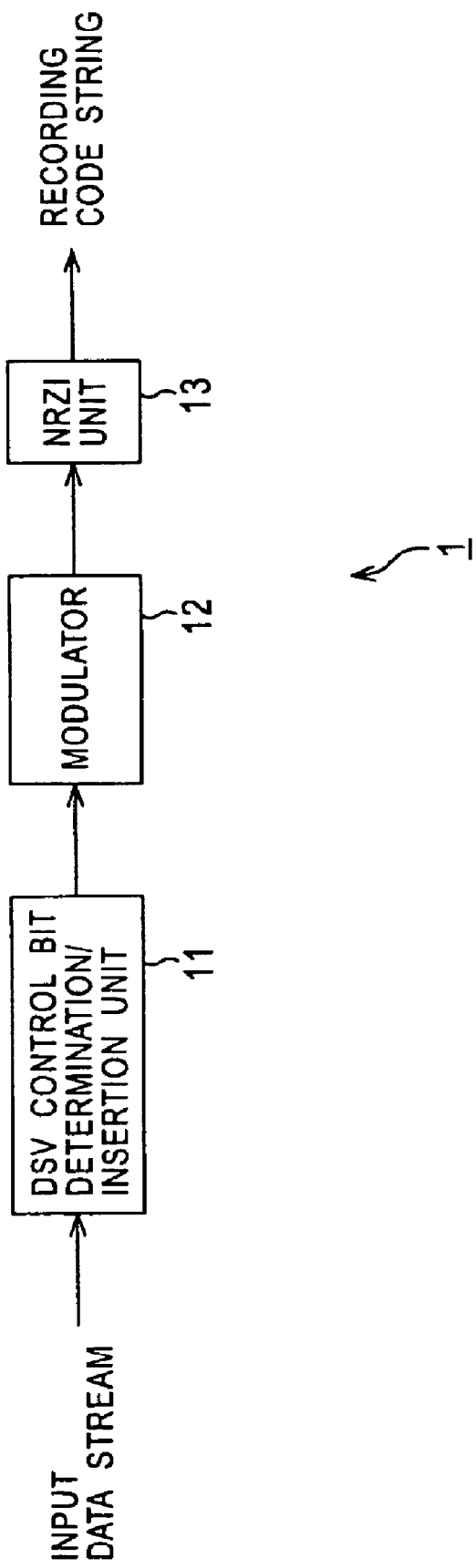
FIG. 1 is a block diagram showing an example of the configuration of a known modulation apparatus.
Figure 2:
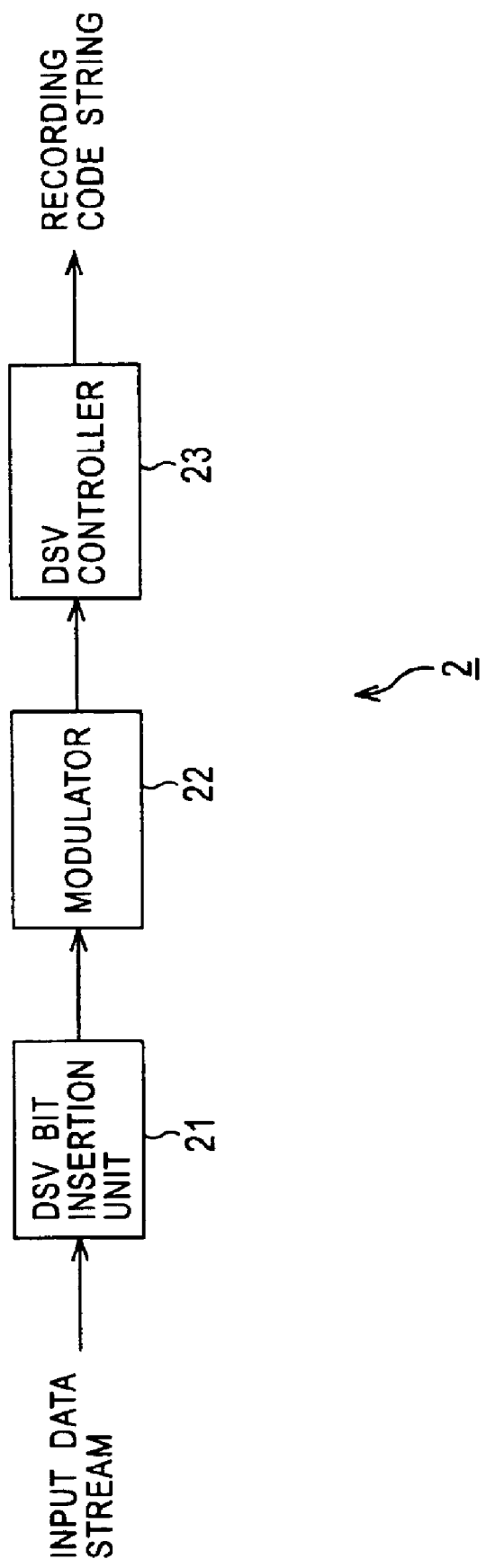
FIG. 2 is a block diagram showing an example of the configuration of another known modulation apparatus.
Figure 3:
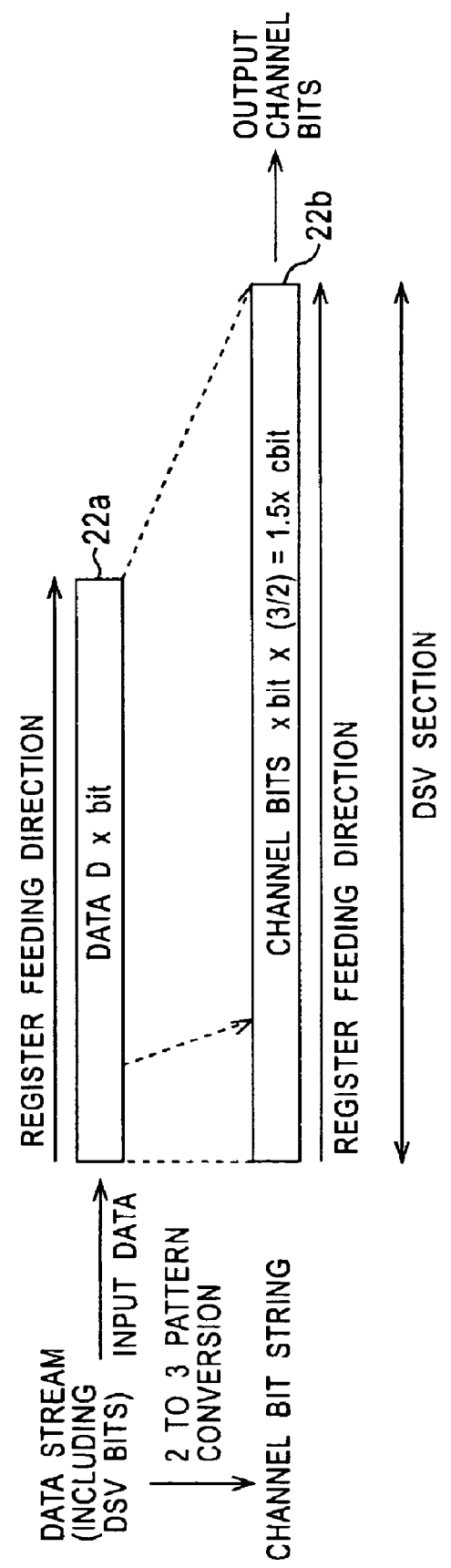
FIG. 3 is a diagram showing an example of the register configuration in a modulator of the modulation apparatus shown in FIG. 2.

As described above, according to the modulation apparatus 3 of the present invention, as shown in FIG. 9, the number of registers (the input register 81 and the output register 82) in each of the 1,7PP modulator 34, the 1,7PP modulator 45, and the 1,7PP modulator 46 is the minimum number of registers required to perform 1,7PP modulation of each data word and does not depend on the DSV control interval since the portion that performs 1,7PP modulation has an independent structure. On the other hand, registers in a known modulating apparatus (e.g., the modulation apparatus 2 shown in FIG. 2) must be of sufficient number corresponding to the DSV control interval, as shown in FIG. 3.

In the delay processor 32, only the DSV section delay shift register 61) is required, which consists of registers, the number of which corresponds to the total of the channel bit string corresponding to the DSV control interval and the circuit delay α (only one shift register is necessary).

Accordingly, the registers required in the modulation apparatus 3 of the present invention are more compact than those in a known modulation apparatus. As a result, the manufacturer can make circuits of the modulation apparatus 3 more compact. A reduction in the number of registers reduces, for example, the power consumption.

In particular, when the DSV control interval is increased or the conversion table for converting a data word into a codeword becomes smaller, the advantage of using the modulation apparatus 3 becomes more apparent.

A series of the above-described processes may be executed by hardware or software. In the latter case, for example, the modulation apparatus 4 includes a personal computer shown in FIG. 10.

Referring to FIG. 10, a CPU 101 performs various processes in accordance with a program stored in a ROM 102 or a program loaded from a storage unit 108 into a RAM 103. If necessary, the RAM 103 stores data necessary for the CPU 101 to perform the various processes.

The CPU 101, the ROM 102, and the RAM 103 are interconnected with one another via a bus 104. An input/output interface 105 is connected to the bus 104.

An input unit 106 including a keyboard and a mouse, an output unit 107 including a display, the storage unit 108 including a hard disk, a communication unit 109 including a modem and a terminal adapter are connected to the input/output interface 105. The communication unit 109 performs communication via a network including the Internet.

If necessary, a drive 110 is connected to the input/output interface 105. A magnetic disk 121, an optical disk 122, a magneto-optical disk 123, or a semiconductor memory 124 is appropriately placed on the drive 111, and a computer program read from the placed medium is installed into the storage unit 108 if necessary.

When a series of processes is to be performed using software, a program providing the software is installed via a network or a recording medium onto a computer included in dedicated hardware or, for example, a general personal computer capable of performing various functions by installing therein various programs.

As shown in FIG. 10, the recording medium includes a packaged medium including the magnetic disk 121 (including a floppy disk), the optical disk 122 (including a CD-ROM (Compact Disk-Read Only Memory) and DVD (Digital Versatile Disk)), the magneto-optical disk 123 (including MD (Mini-Disk)), or the semiconductor memory 124, all of which have recorded thereon the program and which are distributed, separately from the apparatus, to supply the program to the user. Also, the recording medium includes the ROM 102 or the hard disk included in the storage unit 108, which have recorded thereon the program and which are included in advance in the apparatus to be supplied to the user.

In this specification, steps for writing the program stored in the recording medium not only include time-series processing performed in accordance with the described order but also include parallel or individual processing, which may not necessarily be performed in time series.

INDUSTRIAL APPLICABILITY

As described above, according to a modulation apparatus and method and to a DSV-control-bit generating method of the present invention, an increase in circuit size of the modulation apparatus is suppressed.

What is claimed is:

1. A modulation apparatus for generating a channel bit string from an input bit string and generating a recording code string or a transmission code string from the channel bit string, comprising:
    DSV-control-bit generating means for generating a DSV control bit to be inserted into the input bit string in order to control a DSV of the recording code string or the transmission code string;
    timing adjusting means for adjusting transmission timing for transmitting the input bit string;
    DSV-control-bit-inserted bit string generating means for generating a DSV-control-bit-inserted bit string by inserting the DSV control bit generated by the DSV-control-bit generating means into a predetermined position of the input bit string whose transmission timing is adjusted by the timing adjusting means; and
    first modulation means for modulating the DSV-control-bit-inserted bit string generated by the DSV-control-bit-inserted bit string generating means-into the channel bit string on the basis of a conversion rule (d, k; m, n; r), where d is the minimum run length, k is the maximum run length, m is the length of basic data prior to conversion, n is the length of basic channel bits subsequent to conversion and r is the maximum constraint length.

2. The modulation apparatus according to claim 1, further comprising NRZI means for performing NRZI modulation of the channel bit string generated by modulation by the first modulation means to generate the recording code string or the transmission code string.

3. The modulation apparatus according to claim 1, wherein the conversion rule states that the remainder of the number of "1s" in a predetermined block of the input bit string or the DSV-control-bit-inserted bit string divided by two equals the remainder of the number of "1s" in the corresponding block of the channel bit string divided by two.

4. The modulation apparatus according to claim 1, wherein the conversion rule states that the number of consecutive minimum run length d of the channel bit string is limited to a predetermined number or less.

5. The modulation apparatus according to claim 1, wherein the conversion rule states a variable-length code (d, k; m, n; r),
    where the minimum run length d=1, the maximum run length k=7, the length of basic data prior to conversion m=2, and the length of basic channel bits subsequent to conversion n=3.

6. The modulation apparatus according to claim 1, wherein data of m length, which is the length of basic data, is input for a time period in which the channel bit string of n length, which is the length of the basic channel bits, is output.

7. The modulation apparatus according to claim 1, wherein the DSV-control-bit generating mean includes:
    first-candidate-bit-inserted bit string generating means for generating a first-candidate-bit-inserted bit string, which is a candidate for the DSV-control-bit-inserted bit string, by inserting a first candidate bit for the DSV control bit into the predetermined position of the input bit string;
    second-candidate-bit-inserted bit string generating means for generating a second-candidate-bit-inserted bit string, which is another candidate for the DSV-control-bit-inserted bit string, by inserting a second candidate bit for the DSV control bit into the predetermined position of the input bit string;
    second modulation means for modulating, on the basis of the same conversion rule as the conversion rule used by the first modulation means, the first-candidate-bit-inserted bit string generated by the first-candidate-bit-inserted bit string generating means into a first candidate channel bit string, which is a candidate for the channel bit string, and for modulating the second-candidate-bit-inserted bit string generated by the second-candidate-bit-inserted bit string generating means into a second candidate channel bit string, which is another candidate for the channel bit string;
    DSV calculating means for calculating a DSV of each of the first and second candidate channel bit strings generated by modulation by the second modulation means; and
    DSV control bit determining means for determining one of the first and second candidate bits as the DSV control bit on the basis of the DSVs calculated by the DSV calculating means.

8. The modulation apparatus according to claim 7, wherein the DSV calculating means includes:
    section DSV calculating means for calculating a section DSV of a current DSV control section of each of the first and second candidate channel bit strings;
    cumulative DSV calculating means for calculating a cumulative DSV on the basis of the determination result by the DSV control bit determining means; and
    adding means for calculating the DSV by adding each section DSV calculated by the section DSV calculating means and the cumulative DSV immediately before the current DSV control section, the cumulative DSV being calculated by the cumulative DSV calculating means.

9. The modulation apparatus according to claim 7, wherein the first and second modulation means each have a minimum number of registers required to perform modulation based on the coding rule.

10. The modulation apparatus according to claim 1, further comprising:
first sync signal inserting means for inserting a sync pattern including a preset unique pattern into the channel bit string,
wherein the DSV-control-bit generating means includes second sync signal inserting means for inserting the same sync pattern as the sync pattern inserted by the first sync signal inserting means into each of the first and second candidate channel bit strings generated by modulating the first- and second-candidate-bit-inserted bit strings generated by inserting the first and second candidate bits, respectively, into the input bit string, and
wherein the DSV calculating means calculates the DSV on the basis of each of the first and second candidate channel bit strings, each of which includes the sync pattern inserted by the second sync signal inserting means.

11. The modulation apparatus according to claim 1, wherein the timing adjusting means adjusts the transmission timing by adding a delay time to the input bit string.

12. The modulation apparatus according to claim 1, wherein the timing adjusting means inserts a temporary value prior to determination of the DSV control bit into the input bit string at predetermined intervals.

13. The modulation apparatus according to claim 1, further comprising checking information generating means for calculating a final cumulative DSV of the recording code string or the transmission code string, determining whether or not the calculated final cumulative DSV is within a predetermined range, and generating checking information on the basis of the determination result,
wherein the DSV-control-bit generating means generates the DSV control bit on the basis of the checking information generated by the checking information generating means.

14. The modulation apparatus according to claim 13, wherein, when it is determined that the final cumulative DSV is out of the predetermined range, the checking information generating means resets the final cumulative DSV to zero and generates an error signal serving as the checking information, and
wherein the DSV-control-bit generating means internally calculates a cumulative DSV for generating the DSV control bit and, when the error signal is generated by the checking information generating means, resets the cumulative DSV to zero.

15. A modulation method for a modulation apparatus for generating a channel bit string from an input bit string and generating a recording code string or a transmission code string from the channel bit string, comprising:
a DSV-control-bit generating step of generating a DSV control bit to be inserted into the input bit string in order to control a DSV of the recording code string or the transmission code sting;
a timing adjusting step of adjusting transmission timing for transmitting the input bit sting;
a DSV-control-bit-inserted bit string generating step of generating a DSV-control-bit-inserted bit string by inserting the DSV control bit generated in the DSV-control-bit generating step into a predetermined position of the input bit string whose transmission timing is adjusted in the timing adjusting step; and
a modulation step of modulating the DSV-control-bit-inserted bit string generated in the DSV-control-bit-inserted bit string generating step into the channel bit string on the basis of a conversion rule (d, k; m, n; r), where d is the minimum run length, k is the maximum run length, m is the length of basic data prior to conversion, n is the length of basic channel bits subsequent to conversion and r is the maximum constraint length.

16. A recording medium providing a computer-readable computer program for controlling a modulation apparatus for generating a channel bit string from an input bit string and generating a recording code string or a transmission code string from the channel bit string, the program comprising:
a DSV-control-bit generating step of generating a DSV control bit to be inserted into the input bit string in order to control a DSV of the recording code string or the transmission code string;
a timing adjusting step of adjusting transmission timing for transmitting the input bit string;
a DSV-control-bit-inserted bit string generating step of generating a DSV-control-bit-inserted bit string by inserting the DSV control bit generated in the DSV-control-bit generating step into a predetermined position of the input bit string whose transmission timing is adjusted in the timing adjusting step; and
a modulation step of modulating the DSV-control-bit-inserted bit string generated in the DSV-control-bit-inserted bit string generating step into the channel bit string on the basis of a conversion rule (d, k; m, n; r), where d is the minimum run length, k is the maximum run length, m is the length of basic data prior to conversion, n is the length of basic channel bits subseauent to conversion and r is the maximum constraint length.

17. A program for causing a computer that controls a modulation apparatus for generating a channel bit string from an input bit string and generating a recording code string or a transmission code string from the channel bit string to perform a process comprising:
a DSV-control-bit generating step of generating a DSV control bit to be inserted into the input bit string in order to control a DSV of the recording code string or the transmission code string;
a timing adjusting step of adjusting transmission timing for transmitting the input bit string;
a DSV-control-bit-inserted bit string generating step of generating a DSV-control-bit-inserted bit string by inserting the DSV control bit generated in the DSV-control-bit generating step into a predetermined position of the input bit string whose transmission timing is adjusted in the timing adjusting step; and
a modulation step of modulating the DSV-control-bit-inserted bit string generated in the DSV-control-bit-inserted bit string generating step into the channel bit string on the basis of a conversion rule (d, k; m, n; r), where d is the minimum run length, k is the maximum run length, m is the length of basic data prior to conversion, n is the length of basic channel bits subsequent to conversion and r is the maximum constraint length.

18. A DSV-control-bit generating method for generating a DSV control bit to be inserted into an input bit string, comprising:
a first-candidate-bit-inserted bit string generating step of generating a first-candidate-bit-inserted bit string, which is a candidate for a DSV-control-bit-inserted bit string, by inserting a first candidate bit for the DSV control bit into a predetermined position of the input bit string;

a second-candidate-bit-inserted bit string generating step of generating a second-candidate-bit-inserted bit string, which is another candidate for the DSV-control-bit-inserted bit string, by inserting a second candidate bit for the DSV control bit into the predetermined position of the input bit string;

a modulation step of modulating, on the basis of the same conversion rule as a conversion rule applied when modulating the input bit string, the first-candidate-bit-inserted bit string generated in the first-candidate-bit-inserted bit string generating step into a first candidate channel bit string, which is a candidate for a channel bit string generated from the input bit string, and for modulating the second-candidate-bit-inserted bit string generated in the second-candidate-bit-inserted bit string generating step into a second candidate channel bit string, which is another candidate for the channel bit string;

a DSV calculating step of calculating a DSV of each of the first and second candidate channel bit strings generated by modulation in the modulation step; and a DSV control bit determining step of determining one of the first and second candidate bits as the DSV control bit on the basis of the DSVs calculated in the DSV calculating step.

19. A recording medium providing a computer-readable program for generating a DSV control bit to be inserted into an input bit string, the program comprising:

a first-candidate-bit-inserted bit string generating step of generating a first-candidate-bit-inserted bit string, which is a candidate for a DSV-control-bit-inserted bit string, by inserting a first candidate bit for the DSV control bit into a predetermined position of the input bit string;

a second-candidate-bit-inserted bit string generating step of generating a second-candidate-bit-inserted bit string, which is another candidate for the DSV-control-bit-inserted bit string, by inserting a second candidate bit for the DSV control bit into the predetermined position of the input bit string;

a modulation step of modulating, on the basis of the same conversion rule as a conversion rule applied when modulating the input bit string, the first-candidate-bit-inserted bit string generated in the first-candidate-bit-inserted bit string generating step into a first candidate channel bit string, which is a candidate for a channel bit string generated from the input bit string, and for modulating the second-candidate-bit-inserted bit string generated in the second-candidate-bit-inserted bit string generating step into a second candidate channel bit string, which is another candidate for the channel bit string;

a DSV calculating step of calculating a DSV of each of the first and second candidate channel bit strings generated by modulation in the modulation step; and a DSV control bit determining step of determining one of the first and second candidate bits as the DSV control bit on the basis of the DSVs calculated in the DSV calculating step.

20. A program for generating a DSV control bit to be inserted into an input bit string, the program causing a computer to perform a process comprising:

a first-candidate-bit-inserted bit string generating step of generating a first-candidate-bit-inserted bit string, which is a candidate for a DSV-control-bit-inserted bit string, by inserting a first candidate bit for the DSV control bit into a predetermined position of the input bit string;

a second-candidate-bit-inserted bit string generating step of generating a second-candidate-bit-inserted bit string, which is another candidate for the DSV-control-bit-inserted bit string, by inserting a second candidate bit for the DSV control bit into the predetermined position of the input bit string;

a modulation step of modulating, on the basis of the same conversion rule as a conversion rule applied when modulating the input bit string, the first-candidate-bit-inserted bit string generated in the first-candidate-bit-inserted bit string generating step into a first candidate channel bit string, which is a candidate for a channel bit string generated from the input bit string, and for modulating the second-candidate-bit-inserted bit string generated in the second-candidate-bit-inserted bit string generating step into a second candidate channel bit string, which is another candidate for the channel bit string;

a DSV calculating step of calculating a DSV of each of the first and second candidate channel bit strings generated by modulation in the modulation step; and a DSV control bit determining step of determining one of the first and second candidate bits as the DSV control bit on the basis of the DSVs calculated in the DSV calculating step.

* * * * *